(12) United States Patent
Kishi

(10) Patent No.: US 9,538,068 B2
(45) Date of Patent: *Jan. 3, 2017

(54) IMAGE PICKUP APPARATUS AND FOCUS DETECTION METHOD

(71) Applicant: CANON KABUSHIKI KAISHA, Tokyo (JP)

(72) Inventor: Takafumi Kishi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

This patent is subject to a terminal disclaimer.

(21) Appl. No.: 14/689,729

(22) Filed: Apr. 17, 2015

(65) Prior Publication Data

US 2015/0222811 A1    Aug. 6, 2015

Related U.S. Application Data

(62) Division of application No. 13/625,470, filed on Sep. 24, 2012, now Pat. No. 9,048,152.

(30) Foreign Application Priority Data

Sep. 27, 2011    (JP) ................. 2011-210018

(51) Int. Cl.
*H04N 5/232* (2006.01)
*G02B 7/34* (2006.01)
(Continued)

(52) U.S. Cl.
CPC ............ *H04N 5/23212* (2013.01); *G02B 7/34* (2013.01); *H01L 27/14601* (2013.01); *H04N 5/3696* (2013.01)

(58) Field of Classification Search
CPC ................ H04N 5/23212; H04N 5/3696
See application file for complete search history.

(56) References Cited

U.S. PATENT DOCUMENTS 6,781,632 B1 *  8/2004  Ide ................... G03B 13/00
                                                 250/201.2
9,048,152 B2 *  6/2015  Kishi ..................... G02B 7/34
(Continued)

FOREIGN PATENT DOCUMENTS

JP   2002-314062 A   10/2002
JP   2006-178076 A    7/2006
WO   2012/132827 A1  10/2012

OTHER PUBLICATIONS

Jul. 7, 2015 Japanese Office Action, that issued in Japanese Patent Application No. 2011-210018.

(Continued)

*Primary Examiner* — Aung S Moe
*Assistant Examiner* — John H Morehead, III
(74) *Attorney, Agent, or Firm* — Cowan, Liebowitz & Latman, P.C.

(57) ABSTRACT

The image pickup apparatus includes an image sensor photoelectrically converting paired object images formed by light fluxes from mutually different pupil areas of an image capturing optical system, a signal producing part producing, by using output from each of plural pixel lines in a focus detection area in the image sensor, paired image signals corresponding to the paired object images for each pixel line, a calculating part calculating a defocus amount by using the paired image signals produced for each pixel line. The calculating part shifts the paired image signals relatively, produce first correlation data showing change of a correlation value of the paired image signals according to their relative shift amount, adds the first correlation data produced for the respective plural pixel lines to produce second correlation data, and calculates the defocus amount from the second correlation data.

11 Claims, 10 Drawing Sheets

(51) Int. Cl.
*H01L 27/146* (2006.01)
*H04N 5/369* (2011.01)

(56) References Cited

U.S. PATENT DOCUMENTS

| | | | | |
|---|---|---|---|---|
| 2003/0123871 | A1* | 7/2003 | Yoshida | G02B 7/34 396/123 |
| 2009/0135273 | A1* | 5/2009 | Kusaka | H04N 5/23212 348/222.1 |
| 2009/0256952 | A1* | 10/2009 | Kusaka | G02B 27/16 348/349 |
| 2009/0295964 | A1* | 12/2009 | Utagawa | H04N 5/2254 348/302 |
| 2011/0205423 | A1* | 8/2011 | Tsukada | G02B 7/38 348/345 |
| 2012/0044406 | A1* | 2/2012 | Shimoda | G02B 7/365 348/345 |
| 2012/0242888 | A1* | 9/2012 | Muramatsu | G03B 13/18 348/345 |
| 2015/0222811 | A1* | 8/2015 | Kishi | G02B 7/34 348/349 |

OTHER PUBLICATIONS

British Office Action issued on Mar. 30, 2015, that issued in the corresponding British European Patent Application No. 1217302.7.

\* cited by examiner

FIG. 5B  IN-FOCUS

FIG. 5C  FRONT FOCUS

FIG. 5D  REAR FOCUS

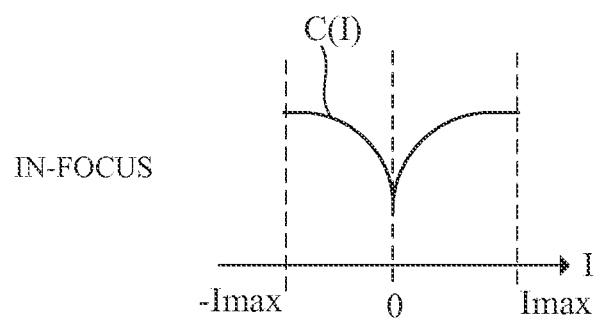
FIG. 8A  IN-FOCUS
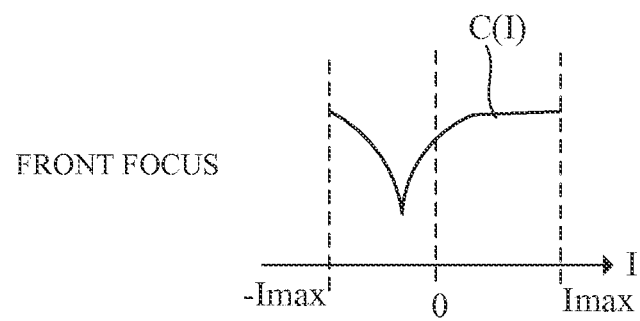
FIG. 8B  FRONT FOCUS
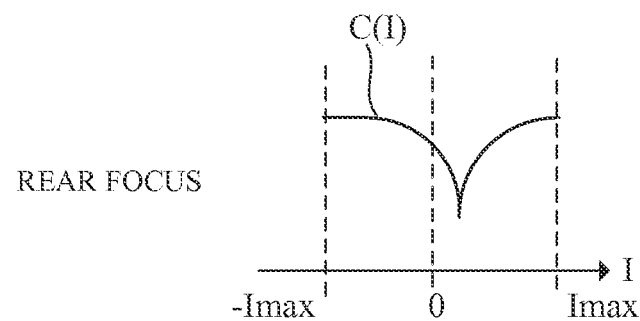
FIG. 8C  REAR FOCUS

IMAGE PICKUP APPARATUS AND FOCUS DETECTION METHOD

CROSS-REFERENCE TO RELATED APPLICATION

This application is a divisional of application Ser. No. 13/625,470, filed Sep. 24, 2012, the entire disclosure of which is hereby incorporated by reference.

BACKGROUND OF THE INVENTION

Field of the Invention

The present invention relates to an image pickup apparatus that detects a focus state of an image capturing optical system by using output from an image sensor for photoelectrically converting an object image.

Description of the Related Art

Such an image pickup apparatus photoelectrically converts, by plural focus detecting pixels provided in the image sensor, paired object images formed by light fluxes passing through mutually different two areas (hereinafter referred to as "two pupil areas") in an exit pupil of the image capturing optical system to produce paired image signals from the focus detecting pixels. The image pickup apparatus performs correlation calculation on the paired image signals to calculate a phase difference, which is a relative positional difference amount (image displacement amount), between the paired image signals, and then calculates a defocus amount corresponding to a focus state of the image capturing optical system. Such a focus detection method is referred to as "an image sensor phase difference detection method".

Japanese Patent Laid-Open Nos. 2001-083407 and 2001-250931 disclose image pickup apparatuses each of which is provided with an image sensor whose each focus detecting pixel includes one microlens having a light collection effect and two divided photodiodes (each hereinafter abbreviated to as "PD") respectively receiving light fluxes from two respective pupil areas. Providing a plurality of such focus detecting pixels in the image sensor makes it possible to produce the above-mentioned paired image signals.

Moreover, Japanese Patent No. 3592147 and Japanese Patent Laid-Open No. 2010-152161 disclose image pickup apparatuses each of which is provided with an image sensor that includes two focus detecting pixel groups in which apertures of wiring layers formed on a light entrance side further than PDs are shifted with respect to pixel centers in mutually different directions. Providing such two focus detecting pixel groups receiving light fluxes from two pupil areas makes it possible to produce the paired image signals.

In such an image sensor phase difference detection method, it is desirable that each image signal be obtained from a focus detection area provided in the image sensor as a two-dimensional pixel area including plural pixel lines and plural pixel columns. This is because a focus detection area including only one pixel line is too narrow to perform good focus detection. Thus, the image pickup apparatus disclosed in Japanese Patent Laid-Open No. 2010-152161 projects outputs of plural pixels included in each of pixel lines in a direction in which the pixel lines extend, and thereby produces an output of each pixel line.

Then, arranging the outputs of the respective pixel lines in a direction in which pixel columns extend enables production of a one-dimensional image signal from the two-dimensional focus detection area. Furthermore, Japanese Patent Laid-Open No. 2010-152161 discloses a method that produces paired image signals for each pixel line, calculates a phase difference (image displacement amount) of the paired image signals and then adds the image displacement amounts calculated for the plural pixel lines to calculate an image displacement amount for the two-dimensional focus detection area.

However, the first one of the image signal producing methods disclosed in Japanese Patent Laid-Open No. 2010-152161 compresses the output of the two-dimensionally arranged pixels into a one-dimensional output, which deteriorates focus detection performance for a specific object such as a transverse line. On the other hand, the second method disclosed therein requires calculation of an image displacement amount for each pixel line, which ensures a certain degree of focus detection performance, but requires a long calculation time.

SUMMARY OF THE INVENTION

The present invention provides an image pickup apparatus capable of performing focus detection in a focus detection area where pixels are two-dimensionally arranged, for various objects with good accuracy without requiring an excessively long calculation time.

The present invention provides as one aspect thereof an image pickup apparatus includes an image sensor configured to include plural pixels to photoelectrically convert paired object images respectively formed by light fluxes passing through mutually different areas in an exit pupil of an image capturing optical system, a signal producing part configured to produce, by using output from each of plural pixel lines included in a focus detection area in the image sensor, paired image signals corresponding to the paired object images for each pixel line, each pixel line being constituted by the pixels lined in a first direction and the plural pixel lines being arranged in a second direction orthogonal to the first direction, and a calculating part configured to calculate a defocus amount of the image capturing optical system by using the paired image signals produced for each pixel line. The calculating part is configured to shift the paired image signals relatively in the first direction for each pixel line, configured to produce first correlation data showing change of a correlation value of the paired image signals according to their relative shift amount, configured to add the first correlation data produced for the respective plural pixel lines to produce second correlation data, and configured to calculate the defocus amount from the second correlation data.

The present invention provides as another aspect thereof a focus detection method to be used for an image pickup apparatus with an image sensor configured to include plural pixels to photoelectrically convert paired object images respectively formed by light fluxes passing through mutually different areas in an exit pupil of an image capturing optical system. The method includes a step of producing, by using output from each of plural pixel lines included in a focus detection area in the image sensor, paired image signals corresponding to the paired object images for each pixel line, each pixel line being constituted by the pixels lined in a first direction and the plural pixel lines being arranged in a second direction orthogonal to the first direction, and a calculation step of calculating a defocus amount of the image capturing optical system by using the paired image signals produced for each of the pixel lines. The calculating step shifts the paired image signals relatively in the first direction for each pixel line, produces first correlation data showing change of a correlation value of the paired image signals according to their relative shift amount, adds the first correlation data produced for the respective plural pixel lines to produce second correlation data, and calculates the defocus amount from the second correlation data.

Further features of the present invention will become apparent from the following description of exemplary embodiments (with reference to the attached drawings).

BRIEF DESCRIPTION OF THE DRAWINGS

FIGS. 5A to 5D show pixel lines and relationships of paired image signals in a phase difference detection method in Embodiment 1.

FIGS. 8A to 8C show relationships between second correlation data and focus states.

DESCRIPTION OF THE PREFERRED EMBODIMENTS

Exemplary embodiments of the present invention will hereinafter be described with reference to the accompanying drawings.

[Embodiment 1]

Figure 1:
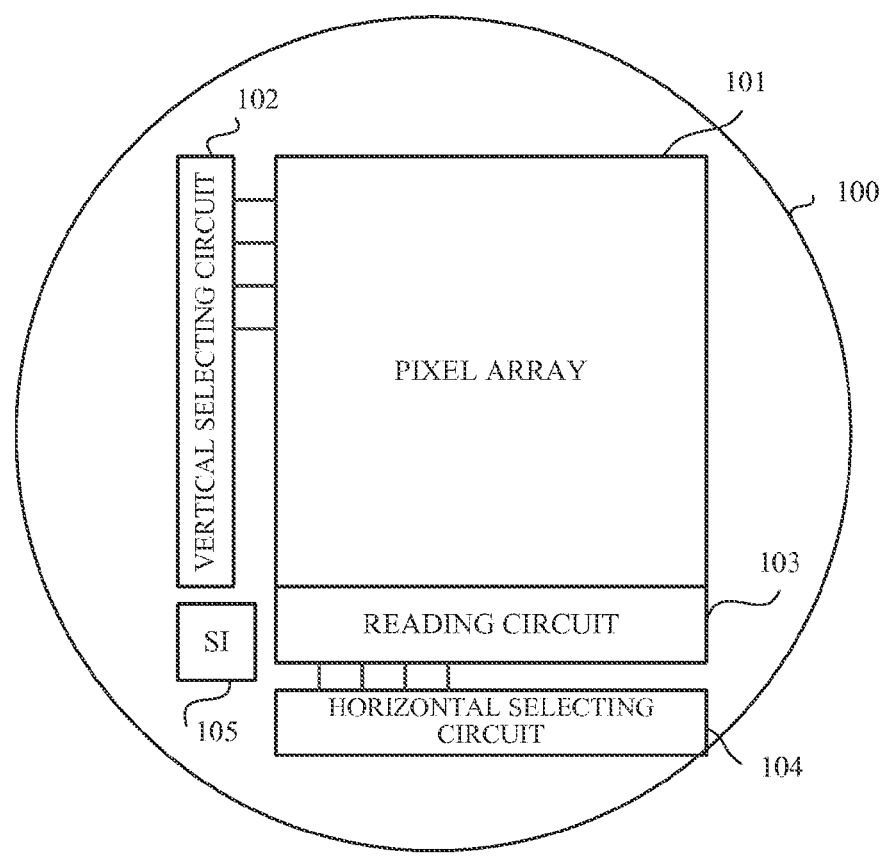
FIG. 1 shows a configuration of an image sensor to be used for an image pickup apparatus that is Embodiment 1 of the present invention.

FIG. 1 shows a configuration of an image sensor (image pickup element) to be used in an image pickup apparatus that is a first embodiment (Embodiment 1) of the present invention. The image sensor 100 is provided with a matrix-like pixel array 101 constituted by plural pixels arranged in a horizontal direction that is a first direction and in a vertical direction that is a second direction orthogonal to the first direction.

In the following description, a group of pixels lined in the horizontal direction is referred to as "a pixel line", and a group of pixels lined in the vertical direction is referred to as "a pixel column". The pixel array 101 includes plural pixel lines each of which includes plural pixels lined in the horizontal direction and which are arranged in the vertical direction. In other words, the pixel array 101 includes plural pixel columns each of which includes plural pixels lined in the vertical direction and which are arranged in the horizontal direction.

The image sensor 100 includes a vertical selecting circuit 102 that selects one of the pixel lines arranged in the vertical direction and a horizontal selecting circuit 104 that selects one of the pixel columns arranged in the horizontal direction. Moreover, the image sensor 100 includes a reading circuit 103 that reads signals (pixel signals) from the pixels in the pixel line selected from the pixel lines in the pixel array 101 by the vertical selecting circuit 102 and a serial interface 105 to be used for setting one of operation modes and the like of each circuit from outside of the apparatus. The reading circuit 103 includes a memory that stores the pixel signals, a gain amplifier, an A/D converter and the like for each pixel line. The image sensor 100 further includes, though not shown, a timing generator that supplies timing signals to the vertical selecting circuit 102, the horizontal selecting circuit 104 and the reading circuit 103, and a controller that controls reading of the pixel signals.

In the image sensor 100 thus configured, the vertical selecting circuit 102 sequentially selects one pixel line from the plural pixel lines, and the reading circuit 103 reads the pixel signals that are outputs of the pixels included in the selected pixel line. The horizontal selecting circuit 104 sequentially selects the pixel signal read by the reading circuit 103 in each pixel line.

Figure 2:
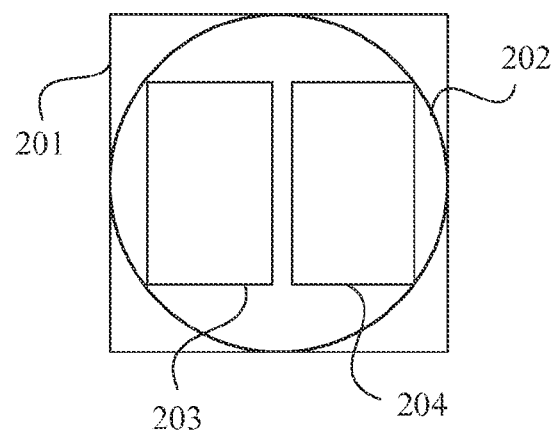
FIG. 2 shows a structure of a pixel in the image sensor in Embodiment 1.

FIG. 2 shows a structure of one pixel in the image sensor 100. The pixel 201 has one microlens 202 and two photodiodes (hereinafter each abbreviated to as "PD") 203 and 204. The pixel 201 further includes, though not shown, a pixel amplifier to read the signal from the PD to the reading circuit 103, a selecting switch to select the pixel, a reset switch to reset the signal from the PD and the like. Calculation of a phase difference of paired signals respectively produced by using the pixel signals from the PDs 203 and 204 enables focus detection of a phase difference detection method.

Figure 3:
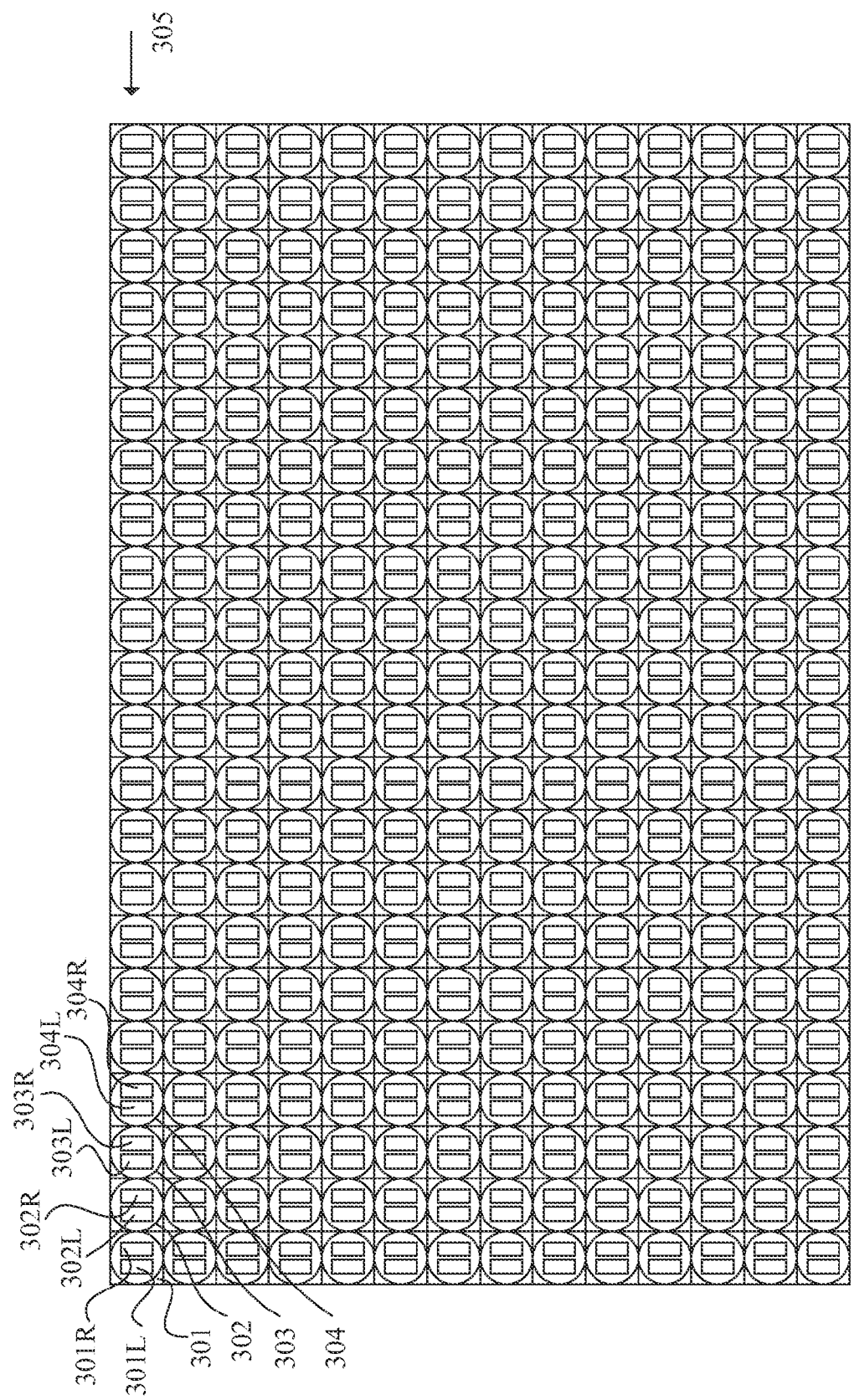
FIG. 3 shows a pixel array in the image sensor in Embodiment 1.

FIG. 3 is an enlarged view of part of the pixel array 101. The pixel array 101 is constituted by arranging the pixels each being shown in FIG. 2 so as to form a two-dimensional array, which enables production of a two-dimensional image. Reference numerals 301, 302, 303 and 304 denote pixels. Reference numerals 301L, 302L, 303L and 304L denote PDs each corresponding to the PD 203 shown in FIG. 2, and reference numerals 301R, 302R, 303R and 304R denote PDs corresponding to the PD 204 shown in FIG. 2. Reference numeral 305 denotes one pixel line.

Figure 4:
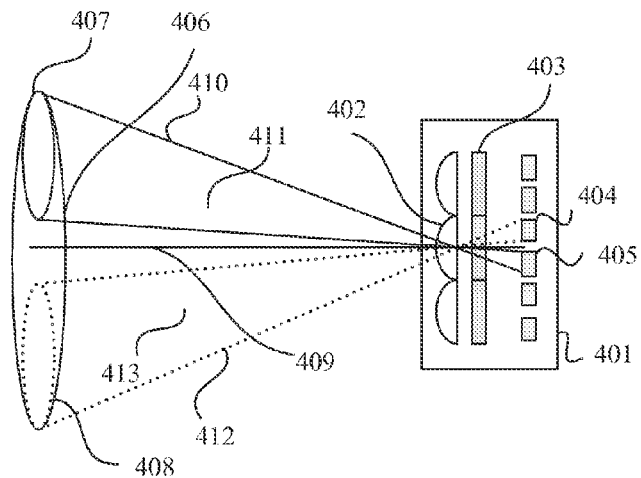
FIG. 4 shows image formation on the image sensor in Embodiment 1.

Description will be made of light reception of the image sensor 100 having the pixel array 101 shown in FIG. 3 with reference to FIG. 4. FIG. 4 shows a state where a light flux passing through an exit pupil 406 of an image capturing optical system enters the image sensor 100. The image capturing optical system (for example, a camera lens) is provided integrally with or interchangeable to the image pickup apparatus (for example, a camera). Reference numeral 401 denotes a cross section of the pixel array. Reference numeral 402 denotes a microlens corresponding to the microlens 202 shown in FIG. 2, and reference numeral 403 denotes a color filter. Reference numerals 404 and 405 denote photodiodes corresponding to the PDs shown in FIG. 2.

In this description, a center of the light flux passing through the exit pupil and entering the pixel having the microlens 402 is defined as an optical axis 409. The light flux from the exit pupil enters the image sensor 100 with a center of the light flux located on the optical axis 409. Reference numerals 407 and 408 show mutually different areas (hereinafter referred to as "pupil areas") of the exit pupil of the image capturing optical system. Outermost peripheral light rays of the light flux passing through the pupil area 407 are denoted by reference numerals 410 and 411, and outermost peripheral light rays of the light flux passing through the pupil area 408 are denoted by reference numerals 412 and 413.

As understood from FIG. 4, of the light flux passing through the exit pupil, an upper light flux with respect to the optical axis 409 enters the PD 405, and a lower light flux with respect thereto enters the PD 404. Thus, the PDs 404 and 405 receive paired light fluxes (that is, paired object images formed by these paired light fluxes) passing through the mutually different pupil areas.

Although FIGS. 2 and 4 show the pixel structure in which two PDs are provided for one microlens, another structure may be employed in which one pixel is provided with one PD whose center is displaced to one side with respect to the optical axis of that pixel and an adjacent pixel is provided with one PD whose center is displaced to another side with respect to the optical axis of that pixel. Using these two pixels as paired pixels to produce paired image signals from the output (pixel signals) therefrom enables focus detection of an image sensor phase difference detection method.

Additionally, a structure may be employed in which a light blocking layer blocks a light flux proceeding toward one side of the microlens so as to provide a same effect as displacing the center of the PD. Thus, the image sensor only needs a structure in which one pixel or paired pixels can receive the light fluxes from the mutually different pupil areas and such pixels are two-dimensionally arranged.

Next, description of the focus detection will be made with reference to FIGS. 5A to 5D. This embodiment sets, in part of the image sensor 100 (pixel array 101), a focus detection area as a pixel area where the plural pixel lines each extending in the horizontal direction are arranged in the vertical direction. Moreover, this embodiment causes the two PDs included in each pixel in the focus detection area to photoelectrically convert the paired object images (hereinafter also referred to as "two images") formed by the paired light flux from the mutually different pupil areas.

Each pixel line can be regarded as including two PD lines that photoelectrically convert the two images. In the following description, each of the PDs is treated as a pixel in the focus detection, and one and the other of the two PD lines are referred to as an "A line pixel" and a "B line pixel".

Figure 5A:
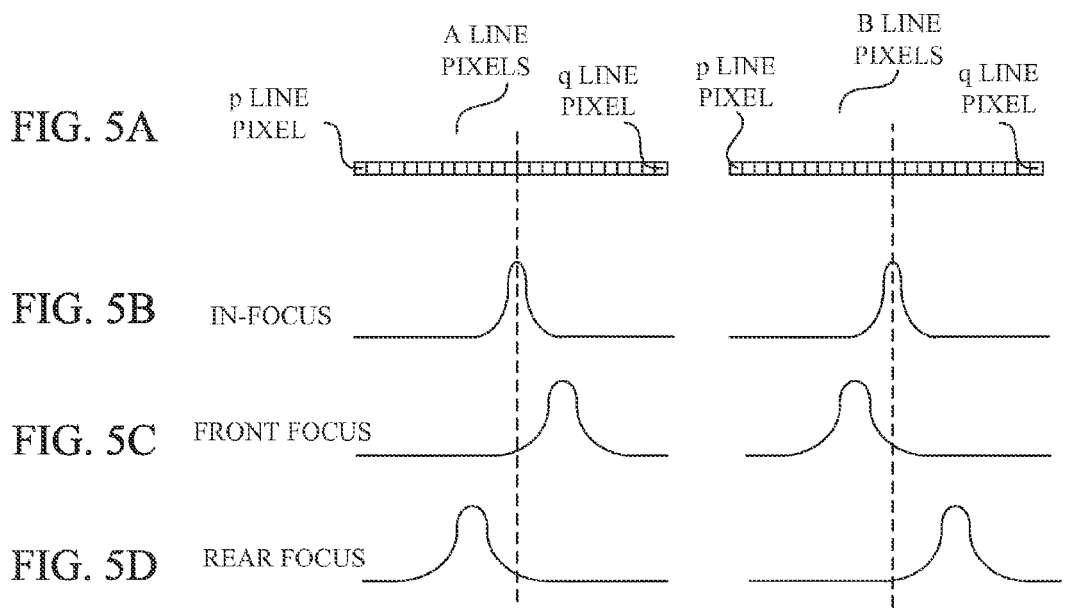

FIG. 5A shows the A and B line pixels included in one pixel line of the focus detection area. FIGS. 5B to 5D show the paired image signals in an in-focus state (FIG. 5B), a front focus state (FIG. 5C) and a rear focus state (FIG. 5D).

In the pixel line 305 shown in FIG. 3, each of the pixels (PDs) 301L, 302L, 303L and 304L corresponds to the A line pixel, and each of the pixels (PDs) 301R, 302R, 303R and 304R corresponds to the B line pixel.

A distance between the paired image signals produced by using outputs from the A line pixel and the B line pixel is changed depending on the above-mentioned focus state (in-focus state, front focus state and rear focus state) of the image capturing optical system. When the focus state of the image capturing optical system is the front focus state or the rear focus state, a focus lens is moved such that the distance between the paired image signals coincides with that in the in-focus state. In other words, an amount of the movement of the focus lens can be calculated from a relative displacement amount (that is, a phase difference, and hereinafter referred to as "an image displacement amount") of the two images corresponding to a defocus amount of the image capturing optical system.

Figure 6A:
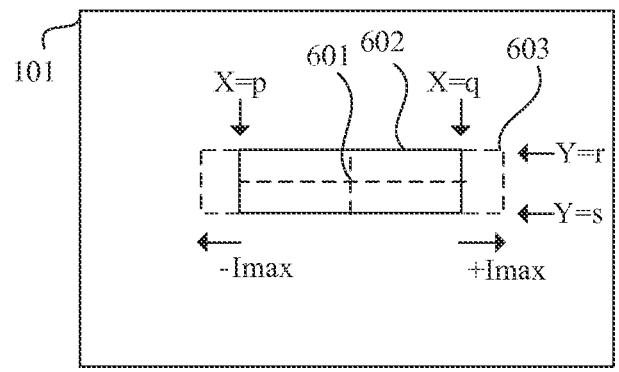
FIGS. 6A and 6B show focus detection areas in the image sensor in Embodiment 1.
Figure 6B:
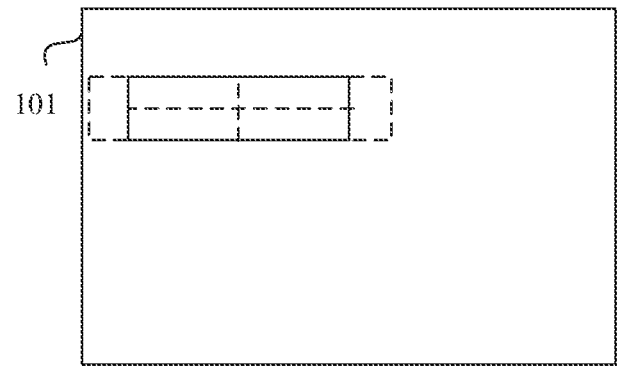

Next, description will be made of a method of calculation of the image displacement amount with reference to FIGS. 6A, 6B and 7. FIGS. 6A and 6B show the focus detection area on the image sensor 100. The focus detection area 602 shown in FIG. 6A whose area center is a point 601 includes pixel lines from p line to q line in an X (horizontal) direction, and pixel columns from r column to s column in a Y (vertical) direction. This focus detection area 602 can be shifted between −Imax and +Imax, which results in that a substantial area where the focus detection can be performed becomes an area 603 including the shift amount (−Imax to +Imax).

FIG. 6B shows a different focus detection area from the focus detection area 603 shown in FIG. 6A. As shown in FIG. 6B, moving the focus detection area enables focus detection in an arbitrary area in the image sensor 100 (in other words, in an image capturing frame).

Figure 7:
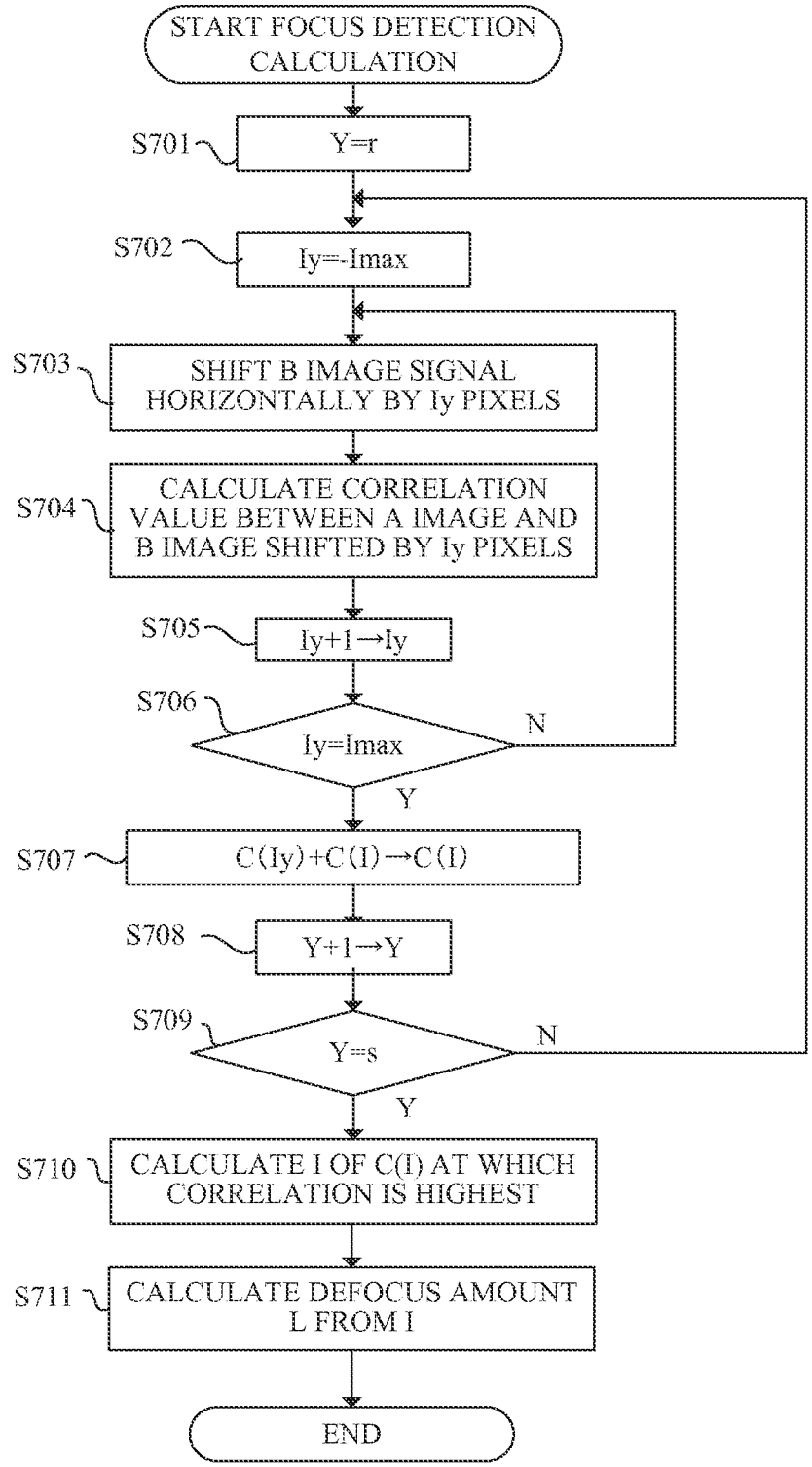
FIG. 7 is a flowchart showing focus detection calculation in Embodiment 1.

A flowchart of FIG. 7 shows processes in the focus detection calculation (focus detection method) that calculates the defocus amount corresponding to the movement amount of the focus lens, from the paired image signals obtained in the focus detection area shown in FIGS. 6A and 6B. This calculation is performed by a calculating part provided in the image pickup apparatus according to a computer program.

At step S701, the calculating part that had started the focus detection calculation selects a first pixel line (Y=r). Next, at step S702, the calculating part sets Iy=−Imax. Since Y is r here, the calculating part calculates an image displacement amount of the A and B line pixels of the r line. In the following description, an object image formed on the A line pixel and an image signal obtained by photoelectric conversion thereof are respectively referred to as "an A image" and "an A image signal", and an object image formed on the B line pixel and an image signal obtained by photoelectric conversion thereof are respectively referred to as "a B image" and "a B image signal".

Next, at step S703, the calculating part shifts the B image signal by a shift amount corresponding to Iy pixels. Next, at step S704, the calculating part calculates a correlation value of the A image signal with the shifted B image signal by using the following expression (1):

$$C(Iy) = \sum_{x=p}^{q} |A_x - B_{x+Iy}| \quad (1)$$

where Ax and Bx respectively represent outputs (pixel values) from pixels whose coordinate is x among the A line pixels and the B line pixels in a specified pixel line. As understood from the above expression (1), the correlation value C(Iy) is expressed as a sum total of absolute values of differences between the A and B image signals relatively shifted by the shift amount that corresponding to Iy pixels.

The correlation value C(Iy) may be calculated by using the following expressions (2):

$$C(Iy) = \sum_{x=p}^{q} |A_{x+Iy} - B_{x-Iy}| \quad (2)$$

The calculating part uses the expression (2) to shift, not only the B image signal obtained from the B line pixel, but also the A image signal obtained from the A line signal in an opposite direction to that of the B image signal, and calculates a sum total of absolute values of differences therebetween. Specifically, the calculating part shifts the A image signal by the shift amount corresponding to Iy pixels, and shifts the B image signal by a shift amount corresponding to −Iy pixels. Also in this case, the correlation value C(Iy) is expressed as the sum total of the absolute values of the differences between the relatively shifted A and B image signals.

Furthermore, the correlation value C(Iy) may be calculated by using the following expression (3), that is, by calculating a sum total of pixel values of larger one of the A image signal and the B image signal shifted (in other words, of the relatively shifted A and B image signals) by the shift amount corresponding to Iy pixels.

$$C(Iy) = \sum_{x=p}^{q} \max(A_x, B_{x+Iy}) \quad (3)$$

In the above expression (3), max(A,B) represents selection of large one of A and B. In addition, though not showing an expression, the correlation value can be calculated by selecting smaller one of A and B. Thus, the correlation value may be calculated by any calculation method.

Next, at step S705, the calculating part substitutes Iy+1 for Iy, in other words, the calculating part shifts the B image signal by a number of pixels of Iy and one pixels. Then, at step S706, the calculating part determines whether or not Iy reaches Imax. If Iy reaches Imax, the calculating part proceeds to step S707. If Iy is smaller than Imax, the calculating part repeats the processes at steps S703, S704 and S705. When the process at step S707 is performed, first correlation data C(Iy) that is an assembly of the correlation values at respective shift positions (Iy) of the B image signal shifted until Iy increases from −Imax to +Imax in one pixel line has been calculated. The first correlation data is obtained as waveform data showing change of the correlation value according to the shift amount (or the shift position) in one pixel line.

At step S707, the calculating part substitutes C(Iy)+C(I) for C(I). In addition, at step S708, the calculating part substitutes Y+1 for Y. Then, at step S709, the calculating part determines whether or not Y reaches s. If Y reaches s, the calculating part proceeds to step S710. If Y is smaller than s, the calculating part returns to step S702. Thus, the calculating part adds the first correlation data C(Iy) calculated in respective r to s lines until Y reaches to s, and thereby acquires second correlation data C(I) that is correlation data of all of the pixel lines (r to s lines) in the focus detection area.

At step S710, the calculating part finds I at which the second correlation data C(I) shows highest correlation. Description about the highest correlation will be made here with reference to FIGS. 8A to 8C. In FIGS. 8A to 8C, the second correlation data C(I) shows the correlation value of the A and B image signals relatively shifted by the shift amount I. When calculating the correlation value as the sum total of the absolute values of the differences of the pixel signals as shown by the expressions (1) and (2), I at which the value of the second correlation data C(I) is lowest is I at which the correlation is highest.

In an in-focus state shown in FIG. 8A, I at which the second correlation data C(I) shows the highest correlation, that is, at which the value of the second correlation data C(I) is lowest is 0. On the other hand, in a front focus state shown in FIG. 8B and a rear focus state shown in FIG. 8C, I at which the second correlation data C(I) shows the highest correlation is I shifted from 0 in its defocus direction. This shift amount I is equivalent to the image displacement amount that is the phase difference. Therefore, the calculating part finds I at which the correlation is highest to calculate the image displacement amount of the A and B line pixels from r to s lines.

Next, at step S711, the calculating part converts the image displacement amount (shift amount I) into a defocus amount L of the image capturing optical system, and then ends the focus detection calculation. Thereafter, though not shown, the calculating part calculates a lens movement amount based on the defocus amount L to move the focus lens by the calculated lens movement amount, which obtains an in-focus state.

As described above, this embodiment calculates the first correlation data for each pixel line in the focus detection area, and produces the second correlation data by adding the first correlation data calculated for all the pixel lines in the focus detection area. Thus, this embodiment needs only one calculation, from the second correlation data, of the image displacement amount at which the correlation is highest, and thereby enables reduction of time required for the focus detection calculation.

Each pixel (pixel including the two PDs) shown in FIGS. 2 and 3 are used not only for the focus detection, but also for production of recording/displaying still and moving images (frame images). Specifically, a process to separately read the pixel signals from the PDs 203 and 204 shown in FIG. 2 in the image sensor 100 and to add these pixel signals enables production of an image capturing pixel signal for one pixel, and enables production of an image by using this image capturing pixel signal.

[Embodiment 2]

Figure 9A:
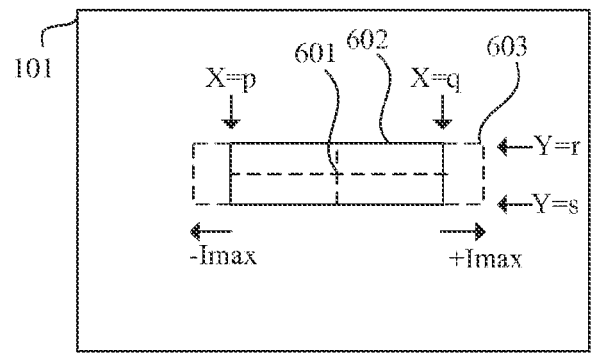
FIGS. 9A and 9B show focus detection areas in an image sensor in Embodiment 2 of the present invention.
Figure 9B:
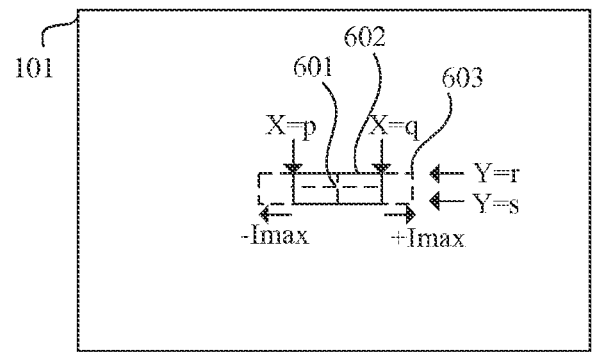

Next, description of a second embodiment (Embodiment 2) of the present invention will be made with reference to FIGS. 9A and 9B. FIGS. 9A and 9B show that a substantial size of a focus detection area 603 to be decided depending on a focus detection area 602 including pixel lines p to q in an X (horizontal) direction and pixel columns r to s in a Y (vertical) direction and on a maximum shift amount Imax can be changed according to image capturing conditions.

The focus detection areas 602 and 603 shown in FIG. 9B are set to be narrower in the horizontal and vertical directions than the focus detection areas 602 and 603 shown in FIG. 9A. The change in sizes of the focus detection areas aims to respond to the fact that the image displacement amount of the A and B images or a size of the A and B images is changed depending on at least one of the image capturing conditions such as a focus state of an image capturing optical system and an F-number thereof.

For example, since the image displacement amount of the A and B images and the size thereof are both large when the image capturing condition is a condition in which the F-number is small and the focus state is a significantly out-of-focus state, the focus detection areas 602 and 603 are set to be large as shown in FIG. 9A. On the other hand, since the image displacement amount of the A and B images and the size thereof are both small when the image capturing condition is a condition in which the F-number is large and the focus state is not such a significantly out-of-focus state, the focus detection areas 602 and 603 are set to be small as shown in FIG. 9B.

It is desirable that the change in size of the focus detection area be performed at image capturing of each still image and at image capturing of each frame of a moving image. Moreover, it is desirable that the change in size of the focus detection area be performed in response to change of the image capturing condition such as the F-number or movement of an object to be captured.

[Embodiment 3]

Next, description of a third embodiment (Embodiment 3) of the present invention will be made with reference to FIG. 10. Embodiment 2 has described the case where it is desirable that the change in size of the focus detection area be performed in the horizontal and vertical directions at image capturing of each still image and at image capturing of each frame of a moving image. However, in the vertical direction in which the pixel lines are arranged, the size of the focus detection area may be changed according to various image capturing conditions, without the image capturing (that is, during the image capturing of each still image and during the image capturing of each frame image).

Figure 10:
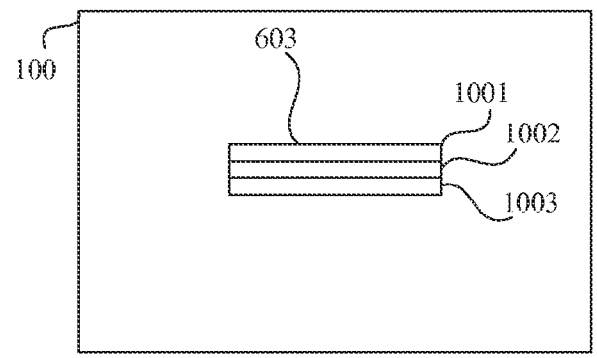
FIG. 10 shows a focus detection area in an image sensor in Embodiment 3 of the present invention.

FIG. 10 shows a state where a substantial focus detection area 603 set in the image sensor 100 is vertically divided into plural areas (each hereinafter referred to as "a divided area") 1001, 1002 and 1003. Each of the divided areas 1001, 1002 and 1003 includes plural pixel lines and plural pixel columns. A calculating part in this embodiment calculates C1(I), C2(I) and C3(I) each being the second correlation data C(I) described in Embodiment 1 from the respective divided areas 1001, 1002 and 1003, and then calculates a defocus amount L from these C1(I), C2(I) and C3(I).

Figure 11:
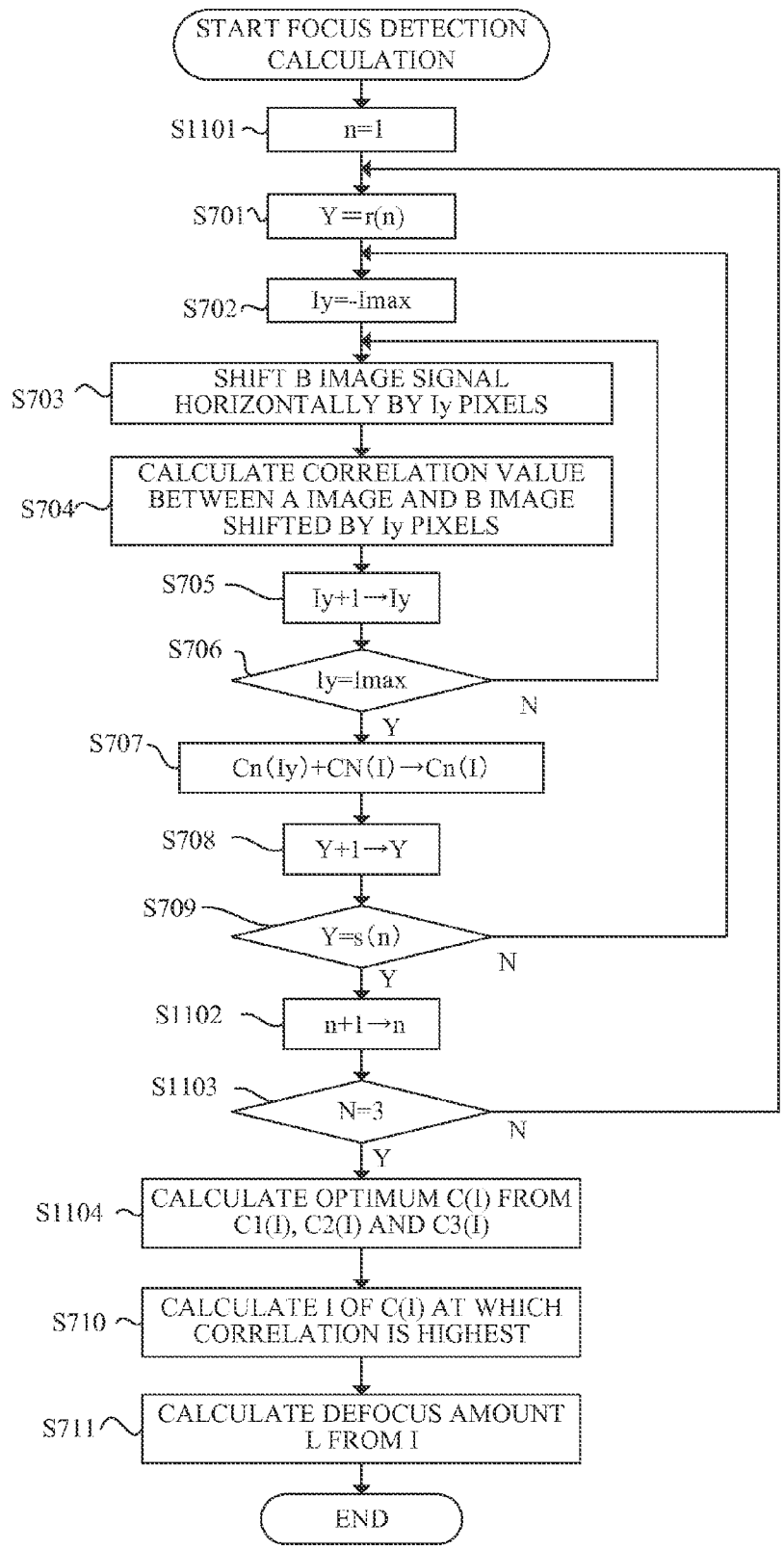
FIG. 11 is a flowchart showing focus detection calculation in Embodiment 3.

Description will be made of processes of focus detection calculation (focus detection method) in this embodiment with reference to a flowchart of FIG. 11. A calculating part provided in the image pickup apparatus performs this focus detection calculation according to a computer program.

At step S1101, the calculating part that has started the focus detection calculation sets n to 1, n being a number given to divided areas 1001, 1002 and 1003, to select a first divided area 1001.

Next, at steps S701 to S709, the calculating part performs same processes as those in Embodiment 1 to calculate the first correlation data C1(Iy) for each pixel line in the first divided area 1001. Then, the calculating part adds the first correlation data C1(Iy) calculated for all the pixel lines in the divided area 1001 to acquire the second correlation data C1(I). At step S707, the calculating part substitutes Cn(Iy)+Cn(I) for Cn(I).

At step S709, the calculating part determines whether or not Y reaches s(n) that represents s line of pixel lines in an n-th divided area. Adding the first correlation data Cn(Iy) calculated for all the pixel lines until Y reaches s(n) enables acquisition of the second correlation data Cn(I) in the n-th divided area. If Y reaches s(n), the calculating part proceeds to step S1102. If Y is smaller than s(n), the calculating part returns to step S701.

At step S1102, the calculating part substitutes n+1 for n. Moreover, at step S1103, the calculating part determines whether or not n reaches 3. If n is smaller than 3, the calculating part selects next divided area and performs the processes at steps S701 to S709 to obtain the second correlation data (C2(I) or C3(I)) for the next divided area. When n thus reaches 3 at step S1103, the calculating part proceeds to step S1104.

At step S1104, the calculating part produces, from C1(I), C2(I) and C3(I) that are the second correlation data Cn(I) of the three divided areas 1001, 1002 and 1003, optimum second correlation data (hereinafter referred to as "optimum correlation data") C(I). Specifically, the calculating part produces the optimum correlation data Cn(I) by adding C1(I), C2(I) and C3(I) when the F-number is small, and on the other hand, produces the optimum correlation data Cn(I) by using only C2(I) when the F-number is large.

Next, at steps S710 and S711, the calculating part calculates, as described in Embodiment 1, a shift amount (image displacement amount) I at which the correlation is highest from the optimum correlation data Cn(I), and calculates a defocus amount L from that shift amount I.

Figure 12:
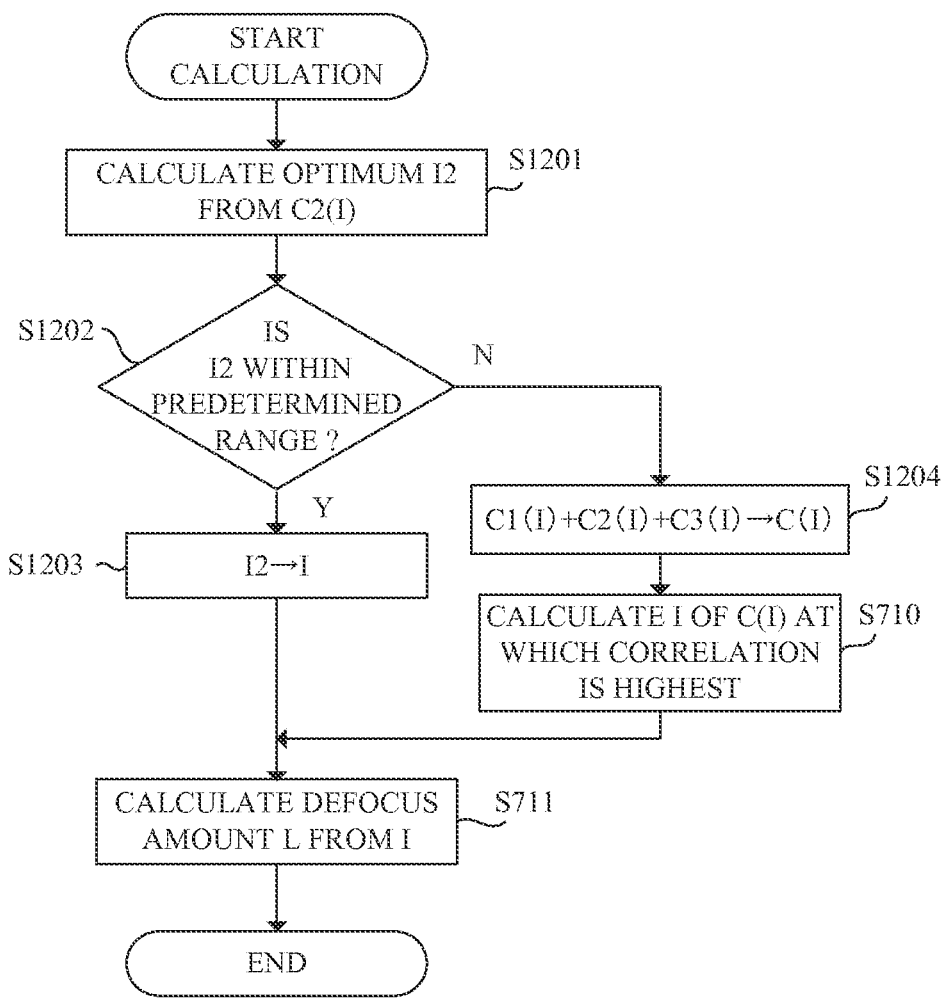
FIG. 12 is a flowchart showing focus detection calculation in a modified example of Embodiment 3.

Hereinafter, description will be made of another method for calculating the defocus amount L from the second correlation data C1(I), C2(I) and C3(I) calculated for the divided areas 1001, 1002 and 1003 with reference to a flowchart of FIG. 12. The following description will be made of processes alternative to the processes at step S1104 and thereafter in FIG. 11.

After calculating the second correlation data C1(I), C2(I) and C3(I) by the processes up to step S1103, the calculating part proceeds to step S1201. At step S1201, the calculating part calculates a shift amount I2 (that is, an image displacement amount in the divided area 1002 as a specific divided area) at which the correlation is highest, from the second correlation data C2(I) calculated for the divided area 1002. The shift amount I2 is calculated by the same method as that described at step S710 in Embodiment 1.

Next, at step S1202, the calculating part determines whether or not the shift amount I2 is within a predetermined range. For example, when the shift amount is small, the F-number is large or the defocus amount is small. If the shift amount I2 is small and within the predetermined range, the calculating part proceeds to step S1203 to substitute I2 for I at which the correlation is highest. Thereafter, the calculating part proceeds to step S711 to calculate the defocus amount L from that I.

On the other hand, when the shift amount is large, the F-number is small or the defocus amount is large. If the shift amount I2 is large and not within the predetermined range, the calculating part proceeds to step S1204 to substitute I2 for I. In this case, it is desirable to set a large focus detection area. Therefore, the calculating part at step S1204 adds the second correlation data C1(I), C2(I) and C3(I) to produce the optimum correlation data C(I).

Then, the calculating part proceeds to steps S710 and S711 to calculate the shift amount (image displacement amount) I at which the correlation is highest, from the optimum correlation data Cn(I), and calculates the defocus amount L from that shift amount I.

As described above, this embodiment, at first, calculates the image displacement amount from the second correlation data produced for the divided area 1002. Then, this embodiment determines whether to use, as the second correlation data for calculating the defocus amount, the second correlation data produced only for the divided area 1002 or the second correlation data respectively produced for the divided areas 1001, 1002 and 1003.

Thus, this embodiment enables, according to the image displacement amount (shift amount I), change of the size of the focus detection area in the direction where the pixel lines are arranged, in image capturing of one still image and in image capturing of one frame image. Moreover, this embodiment calculates the first correlation data for each of the pixel lines in the divided area set by dividing the focus detection area, and adds the first correlation data for all the pixel lines in that divided area to produce the second correlation data for that divided area. Then, this embodiment calculates the image displacement amount (shift amount I) at which the correlation is highest by using the second correlation data. Accordingly, this embodiment needs only one calculation of the image displacement amount (shift amount I), and thereby enables reduction of time required for the focus detection calculation.

Although each of Embodiments 1 to 3 has described the case of producing the first correlation data for each of the pixel lines and adding the first correlation data produced for all the pixel lines to produce the second correlation data, the second correlation data may be produced by adding the first correlation data produced for respective pixel columns and adding the first correlation data produced for all the pixel columns. Moreover, the focus detection calculation described in Embodiment 3 applies also to a case where the focus detection area is divided into plural areas in the horizontal direction in which the pixel columns are arranged.

[Embodiment 4]

Figure 13:
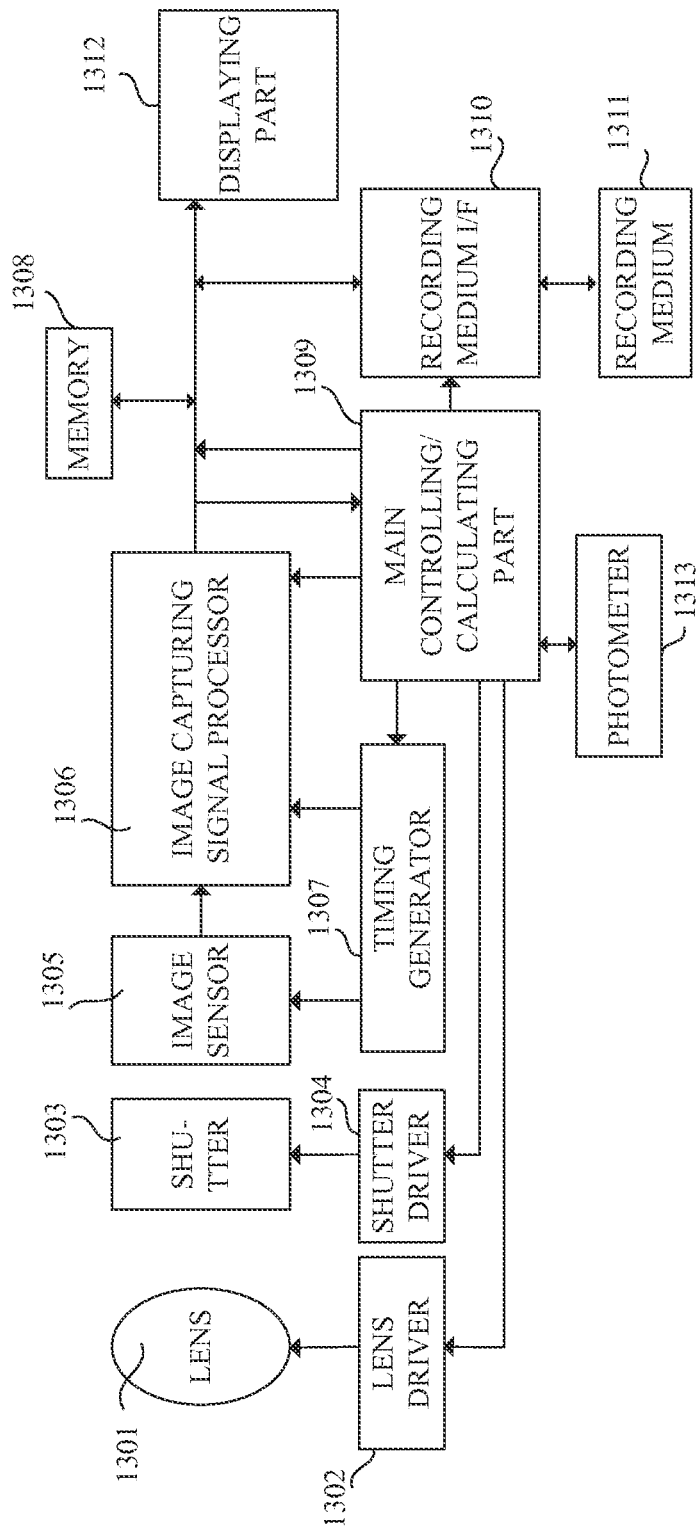
FIG. 13 shows a configuration of an image pickup apparatus that is Embodiment 4 of the present invention.

FIG. 13 shows a digital camera as an image pickup apparatus that is provided with the calculating part (in other words, that performs the focus detection) described in Embodiments 1 to 3. In FIG. 13, reference numeral 1301 denotes an image capturing lens (image capturing optical system) that causes a light flux from an object to form an object image. The image capturing lens 1301 includes a magnification-varying lens, a focus lens and an aperture stop. These lenses and aperture stop are driven by a lens driver 1302 that receives instructions from a main controlling/calculating part 1309 (described later).

Reference numeral 1303 denotes a mechanical shutter to be driven by a shutter driver 1304 that receives an instruction from the main controlling/calculating part 1309. Reference numeral 1305 denotes an image sensor that corresponds to the image sensor 100 in Embodiments 1 to 3 and photoelectrically converts the object image formed by the image capturing lens 1301.

Reference numeral 1306 denotes an image capturing signal processor (signal producing part) that performs various processes on output signals from the image sensor 1305. The image capturing signal processor 1306 produces, from pixel signals output from pixels of each of pixel lines included in a focus detection area in the image sensor 1305, paired image signals.

Reference numeral 1307 denotes a timing generator that outputs timing signals to the image sensor 1305 and the image capturing signal processor 1306. The main controlling/calculating part 1309 controls operations of the entire camera and serves as the calculating part described in Embodiments 1 to 3. Reference numeral 1313 denotes a photometer that performs photometry on the object.

Reference numeral 1308 denotes a memory that temporarily stores images produced by the image capturing signal processor 1306. Reference numeral 1310 denotes a recording medium interface that performs recording and reading of images to and from a recording medium such as a semiconductor memory. The recording medium 1311 is detachably attached to the camera. Reference numeral 1312 denotes a displaying part that displays various information and images.

In the digital camera thus configured, turn-on of a main power supply starts supply of power to a control system including the main controlling/calculating part 1309, and furthermore starts supply of power to an image capturing system including the image capturing signal processor 1306.

Next, in response to a user's operation of a release button (not shown), the main controlling/calculating part 1309 performs, using the paired image signals produced by the image capturing signal processor 1306 for each pixel line in the focus detection area in the image sensor 1305, focus detection and calculation of a defocus amount. Then, the main controlling/calculating part 1309 calculates a movement amount of the focus lens based on the calculation result, and moves the focus lens by the calculated movement amount through the lens driver 1302 to obtain an in-focus state.

After confirming the in-focus state, the main controlling/calculating part 1309 starts an image capturing operation. The main controlling/calculating part 1309 causes the image capturing signal processor 1306 to perform image processing on the output signals from the image sensor 1305 and to produce a captured image (still image or moving image). The main controlling/calculating part 1309 causes the recording medium interface 1310 to write the captured image to the recording medium 1311.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-210018, filed on Sep. 27, 2011, which is hereby incorporated by reference herein in its entirety.

What is claimed is:

1. An image pickup apparatus comprising:
an image sensor configured to include plural pixels in a first direction with respect to a microlens and a second direction orthogonal to the first direction to photoelectrically convert paired object images passing through an image capturing optical system, at least two photo-electrical convertors being formed on each of the plural pixels in the first direction;
a signal producing part configured to produce paired image signals corresponding to the paired object images; and
a calculating part configured to calculate a second correlation data,
wherein the calculating part is configured to shift the paired image signals relatively in the first direction,
configured to produce a plurality of first correlation data showing change of a correlation value of the paired image signals according to their relative shift amount in the first direction, the plurality of first correlation data corresponding to a plurality of areas in the image sensor, and
configured to combine the plurality of first correlation data for producing second correlation data.

2. An image pickup apparatus according to claim 1, wherein the calculating part is configured to produce the first correlation data and the second correlation data for each of plural divided areas formed by dividing the focus detection area, and configured to calculate a defocus amount by using the second correlation data produced for the respective plural divided areas.

3. An image pickup apparatus according to claim 2, wherein the calculating part is configured to switch the second correlation data to be used for calculating the defocus amount, according to a displacement amount of the paired image signals which is obtained from the second correlation data produced for a specific divided area of the plural divided areas, between the second correlation data produced for the specific divided area and the second correlation data produced for the respective plural divided areas.

4. An image pickup apparatus according to claim 1, wherein the calculating part changes a size of the focus detection area depending on at least one of a focus state of the image capturing optical system and an F-number thereof.

5. A focus detection method to be used for an image pickup apparatus with an image sensor configured to include plural pixels in a first direction with respect to a microlens and a second direction orthogonal to the first direction to photoelectrically convert paired object images passing through an image capturing optical system, at least two photoelectrical convertors being formed on each of the plural pixels in the first direction, the method comprising:
    a step of producing paired image signals corresponding to the paired object images; and
    a calculation step of calculating a second correlation data,
    wherein the calculating step shifts the paired image signals relatively in the first direction,
    produces a plurality of first correlation data showing change of a correlation value of the paired image signals according to their relative shift amount in the first direction, the plurality of first correlation data corresponding to a plurality of areas in the image sensor, and
    combines the plurality of first correlation data for producing second correlation data.

6. An image pickup apparatus according to claim 1, wherein the pixels for outputting the paired image signals are constituted by the pixels lined in the first direction.

7. An image pickup apparatus according to claim 6, wherein, the paired image signals are output from areas of the image sensor, the areas corresponding to positions arranged in the second direction.

8. An image pickup apparatus according to claim 1, wherein the paired object images are respectively formed by light fluxes passing through mutually different areas in an exit pupil of an image capturing optical system.

9. An image pickup apparatus according to claim 1, wherein the paired image signals are produced by using output from a focus detection area in the image sensor.

10. An image pickup apparatus according to claim 1, wherein the second correlation data is produced by adding the respective first correlation data.

11. An image pickup apparatus according to claim 1, comprising the calculating part configured to calculate a defocus amount of an image capturing optical system.

* * * * *